(12) United States Patent
Hirler et al.

(10) Patent No.: US 10,211,057 B2
(45) Date of Patent: Feb. 19, 2019

(54) TRANSISTOR COMPONENT WITH REDUCED SHORT-CIRCUIT CURRENT

(75) Inventors: Franz Hirler, Isen (DE); Anton Mauder, Kolbermoor (DE); Thomas Raker, Unterfoehring (DE); Hans-Joachim Schulze, Taufkirchen (DE); Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 2091 days.

(21) Appl. No.: 13/197,903

(22) Filed: Aug. 4, 2011

(65) Prior Publication Data

US 2012/0037955 A1 Feb. 16, 2012

(51) Int. Cl.
*H01L 21/26* (2006.01)
*H01L 29/08* (2006.01)
(Continued)

(52) U.S. Cl.
CPC .. *H01L 21/26506* (2013.01); *H01L 21/26513* (2013.01); *H01L 29/7397* (2013.01);
(Continued)

(58) Field of Classification Search
CPC ......... H01L 21/26; H01L 29/04; H01L 29/06; H01L 29/08; H01L 29/10; H01L 29/73; H01L 29/78
(Continued)

(56) References Cited

U.S. PATENT DOCUMENTS 3,911,269 A 10/1975 Hart et al.
5,198,687 A 3/1993 Baliga
(Continued)

FOREIGN PATENT DOCUMENTS

CN 101364613 A1 2/2009
DE 2211384 A1 11/1972
(Continued)

OTHER PUBLICATIONS

Porst, A., "Ultimate Limits of an IGBT (MCT) for High Voltage Applications in Conjunction with a Diode", Proc. of the 6th Internat. Symposium on Power Semiconductor Devices & IC's, Davos, Switzerland, May 31-Jun. 2, 1994, pp. 163-170.
(Continued)

*Primary Examiner* — Ori Nadav
*Assistant Examiner* — Vernon P Webb
(74) *Attorney, Agent, or Firm* — Murphy, Bilak & Homiller, PLLC (57) ABSTRACT

A transistor component includes in a semiconductor body a source zone and a drift zone of a first conduction type, and a body zone of a second conduction type complementary to the first conduction type, the body zone arranged between the drift zone and the source zone. The transistor component further includes a source electrode in contact with the source zone and the body zone, a gate electrode adjacent the body zone and dielectrically insulated from the body zone by a gate dielectric layer, and a diode structure connected between the drift zone and the source electrode. The diode structure includes a first emitter zone adjoining the drift zone in the semiconductor body, and a second emitter zone of the first conduction type adjoining the first emitter zone. The second emitter zone is connected to the source electrode and has an emitter efficiency $\gamma$ of less than 0.7.

20 Claims, 6 Drawing Sheets

(51) Int. Cl.

| | |
|---|---|
| *H01L 29/78* | (2006.01) |
| *H01L 21/265* | (2006.01) |
| *H01L 29/739* | (2006.01) |
| *H01L 29/04* | (2006.01) |
| *H01L 29/06* | (2006.01) |
| *H01L 29/10* | (2006.01) |
| *H01L 29/165* | (2006.01) |
| *H01L 29/167* | (2006.01) |
| *H01L 29/32* | (2006.01) |

(52) U.S. Cl.
CPC ...... *H01L 29/7804* (2013.01); *H01L 29/7806* (2013.01); *H01L 29/7813* (2013.01); *H01L 29/04* (2013.01); *H01L 29/0696* (2013.01); *H01L 29/0878* (2013.01); *H01L 29/1095* (2013.01); *H01L 29/165* (2013.01); *H01L 29/167* (2013.01); *H01L 29/32* (2013.01); *H01L 2924/0002* (2013.01)

(58) Field of Classification Search
USPC .......................................... 257/140, E27.016
See application file for complete search history.

(56) References Cited

U.S. PATENT DOCUMENTS

| | | |
|---|---|---|
| 5,294,816 A | 3/1994 | Shekar et al. |
| 5,412,228 A | 5/1995 | Baliga |
| 5,488,236 A | 1/1996 | Baliga et al. |
| 5,923,055 A | 7/1999 | Schlangenotto et al. |
| 7,091,513 B1* | 8/2006 | Derraa ............................ 257/13 |
| 7,098,488 B2 | 8/2006 | Yoshikawa et al. |
| 7,319,257 B2 | 1/2008 | Yamaguchi et al. |
| 7,989,885 B2 | 8/2011 | Hirler et al. |
| 2007/0120181 A1* | 5/2007 | Ruething et al. ............. 257/328 |
| 2007/0152268 A1* | 7/2007 | Hille et al. ..................... 257/330 |
| 2008/0230833 A1 | 9/2008 | Zundel et al. |
| 2009/0039419 A1* | 2/2009 | Zundel et al. ................ 257/328 |
| 2010/0230718 A1 | 9/2010 | Hirler et al. |

FOREIGN PATENT DOCUMENTS

| | | |
|---|---|---|
| DE | 10048857 A1 | 4/2002 |
| DE | 102010000531 A1 | 10/2010 |
| WO | 1993022798 A1 | 11/1993 |

OTHER PUBLICATIONS

Wong, H.S., et al., "Selenium Segretation for Lowering the Contact Resistance in Ultrathin-Body MOSFETs With Fully Metallized Source/Drain," IEEE Electron Device Letters, vol. 30, No. 10, Oct. 2009, pp. 1087-1089.

Constapel, R., et al., "Trench-IGBTs with Integrated Diverter Structures", International Symposium on Power Semiconductor Devices, May 23-25, 1995, pp. 201-206, Yokohama, Japan.

* cited by examiner

TRANSISTOR COMPONENT WITH REDUCED SHORT-CIRCUIT CURRENT

PRIORITY CLAIM

This application claims priority to German Patent Application No. 10 2010 039 258.8 filed on 12 Aug. 2010, the content of said application incorporated herein by reference in its entirety.

TECHNICAL FIELD

The present application relates to a transistor component, in particular a MOSFET or an IGBT.

BACKGROUND

Transistor components, such as e.g. power MOSFETs (metal oxide semiconductor field effect transistors) or power IGBTs (insulated gate bipolar transistors), are increasingly being used as electronic switches for switching electrical loads in automotive or industrial applications. Such components are distinguished by a low on resistance in the switched-on state, and hence by low power losses. During normal operation, i.e. in the case of a fault-free load, the voltage drop across the load path of a switched-on power transistor lies in the range of a few hundred millivolts (mV) or a few volts (V). The power transistor is designed to take up the power loss associated with such a voltage drop and the associated load current. If the voltage across the load path of the power transistor rose significantly, as would be the case for example upon the occurrence of a short circuit in the load, then the load current would also rise. During the short-circuit case, the power transistor limits the flowing load current, for which reason the majority of the supply voltage is present at the power transistor. The power loss at the component rises considerably as a result, which could lead to destruction of the component, even before a protective circuit possibly present could turn the component off.

In order to protect a power transistor against such an overload, a diode can be connected in parallel with part of its load path, as is described in Constapel et al. "Trench-IGBTs with Integrated Diverter Structures", ISPSD 1995, pp. 201-205. The diode is connected up in such a way that it limits the voltage drop across that part of the load path with which it is connected in parallel to the value of its forward voltage, as a result of which a maximum current flowing through the component (short-circuit current) is also limited. The voltage drop across that part of the load path with which the diode is connected in parallel is in this case lower than the forward voltage of the diode during the normal operation of the power transistor, such that the diode does not influence the functioning of the power transistor in the switched-on state thereof. In order to realize such a diode, Constapel et al., loc. cit., proposed providing a p-doped region in an n-doped drift zone in an IGBT, this region being connected via a p-type base or body zone and the n-type emitter zone or source zone to a cathode electrode or source electrode. However, the provision of such a structure can lead to a reduction of the dielectric strength of the component when the component is in the off state.

SUMMARY

The embodiments described herein provide a transistor component having a limited short-circuit current and a high dielectric strength.

In one embodiment, a transistor component includes: in a semiconductor body a source zone and a drift zone of a first conduction type; a body zone of a second conduction type complementary to the first conduction type, the body zone being arranged between the drift zone and the source zone; a source electrode in contact with the source zone and the body zone; and a gate electrode adjacent the body zone and dielectrically insulated from the body zone by a gate dielectric layer. The transistor component additionally includes a diode structure connected between the drift zone and the source electrode and which includes: a first emitter zone adjoining the drift zone in the semiconductor body; and a second emitter zone of the first conduction type adjoining the first emitter zone and connected to the source electrode and having an emitter efficiency $\gamma$ of less than 0.7.

In another embodiment, a transistor component includes: in a semiconductor body a source zone and drift zone of a first conduction type; a body zone of a second conduction type complementary to the first conduction type, the body zone being arranged between the drift zone and the source zone; a source electrode in contact with the source zone and the body zone; and a gate electrode adjacent the body zone and dielectrically insulated from the body zone by a gate dielectric layer. The transistor component additionally includes a Schottky diode structure connected between the drift zone and the source electrode.

In the case of the diode structure having the second emitter zone, which has an emitter efficiency of less than 0.7, charge carriers are also injected from the second emitter zone into the first emitter zone, and thus into the drift zone, which are added to the charge carriers which flow via the conducting MOS channel of the component, and which therefore likewise contribute to the short-circuit current. In this case, the low emitter efficiency helps to reduce these charge carriers flowing via the diode structure into the drift zone, wherein the diode structure nevertheless limits the voltage drop across part of the load path of the transistor component. In the case where a Schottky diode is provided between the drift zone and the source electrode, by contrast, when the Schottky diode is turned on, no or virtually no charge carriers are injected into the drift zone. A Schottky diode is—in contrast to a bipolar diode—a unipolar component, such that charge carriers can flow from the first emitter zone in the direction of the source electrode, but without charge carriers being injected into the first emitter zone.

Those skilled in the art will recognize additional features and advantages upon reading the following detailed description, and upon viewing the accompanying drawings.

BRIEF DESCRIPTION OF THE DRAWINGS

Exemplary embodiments are explained in greater detail below with reference to figures. The figures serve for elucidating the basic principle, such that only the features necessary for understanding the basic principle are illustrated. The figures are not true to scale. In the figures, unless indicated otherwise, identical reference symbols designate identical features having the same meaning.

FIG. 2 schematically shows a horizontal cross section through a transistor component including a ring-shaped gate electrode (FIG. 2A) and including a strip-shaped gate electrode (FIG. 2B).

FIG. 5 illustrates, on the basis of FIGS. 5A to 5C, by way of example, a method for producing an emitter zone composed of a polycrystalline semiconductor material.

FIG. 6 illustrates, on the basis of FIGS. 6A and 6B, a method for producing a diode structure of a transistor component, the diode structure having an emitter zone composed of a porous semiconductor material.

FIG. 7 illustrates, on the basis of FIGS. 7A and 7B, a further method for producing an emitter zone of a diode structure of a transistor component.

DETAILED DESCRIPTION

Figure 1:
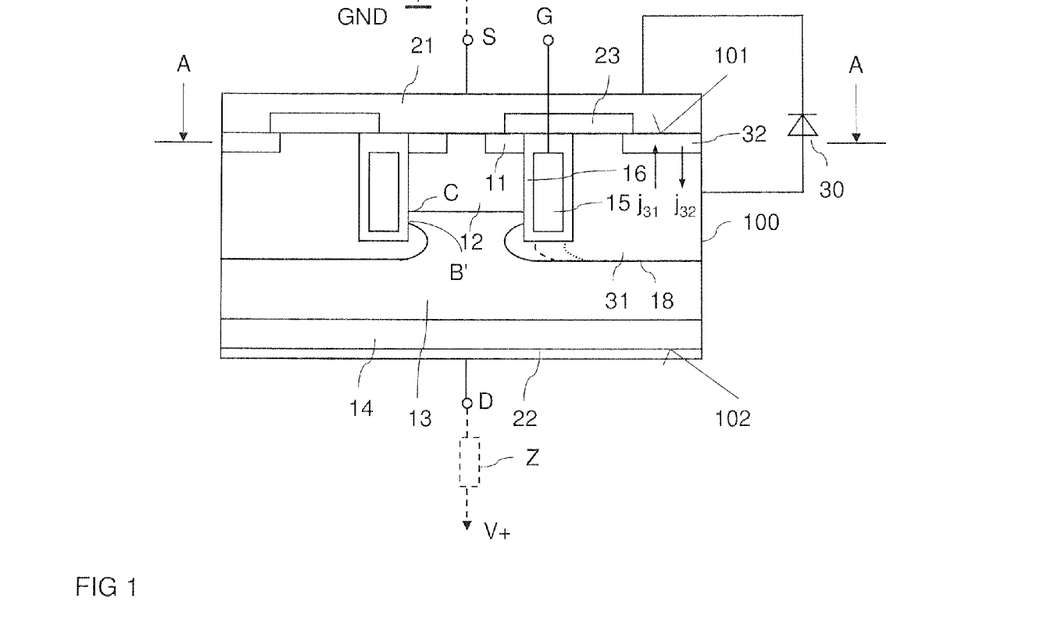
FIG. 1 schematically shows a vertical cross section through a transistor component including a diode structure in accordance with a first exemplary embodiment.

FIG. 1 schematically shows a vertical cross section through a transistor component. The transistor component includes a semiconductor body 100 having a first side 101, which is also designated hereinafter as front side, and a second side 102, which is also designated hereinafter as rear side. FIG. 1 shows a cross section through the component in a vertical sectional plane running perpendicular to the front and rear sides 101, 102 of the semiconductor body 100.

The transistor component has a source zone 11 and a drift zone 13 of a first conduction type, which are arranged in the semiconductor body 100. A body zone 12 of a second conduction type complementary to the first conduction type is arranged between the source zone 11 and the drift zone 13. In the exemplary embodiment illustrated, a drain zone 14 is adjacent to the drift zone 13, wherein a field stop zone (not illustrated) of the first conduction type can be provided between the drain zone 14 and the drift zone 13, the field stop zone being doped more highly than the drift zone 13.

In order to control a conducting channel in the body zone 12 between the source zone 11 and the drift zone 13, the component has a gate electrode 15, which is arranged adjacent the body zone 12 and which is dielectrically insulated from the body zone 12 by a gate dielectric layer 16. In the embodiment illustrated, the gate electrode 15 is arranged in a trench extending into the semiconductor body 100 in a vertical direction preceding from the front side 101.

The gate electrode 15 is electrically conductively connected to a gate connection G, the source zone 11 and the body zone 12 are jointly connected via a source electrode 21 to a source connection S, and the drain zone 14 is connected via a drain electrode 22 to a drain connection D of the transistor component. The transistor component can be realized as a MOSFET or an IGBT. In the case of a MOSFET, the drain zone 14 is of the same conduction type as the drift zone 13 and the source zone 11, that is to say of the first conduction type. In the case of an IGBT, the drain zone 14 is doped complementary to the drift zone 13 and the source zone 11, that is to say is of the second conduction type. In the case of an IGBT, the drain zone 14 and the source zone 11 are also designated as collector zone and emitter zone or as emitter zones, and the drift zone 13 is also designated as base zone. The concept explained below applies equally to a MOSFET or to an IGBT, use being made hereinafter of the designations drain zone, source zone and drift zone introduced above for the individual component zones both for an IGBT and for a MOSFET.

The transistor component can be realized as an n-conducting component. In this case, the component zones of the first conduction type, such as e.g. the source zone 11 and the drift zone 13, are n-doped, while the component zones of the second conduction type, such as, for example, the body zone 12, are p-doped. The component can also be realized as a p-conducting component. In this case, the individual component zones are to be doped complementarily to the component zones of an n-conducting component. The doping concentrations of the source zone 11 and of the drain zone 14 lie, for example, in the range of between $10^{17}$ cm$^{-3}$ and $10^{21}$ cm$^{-3}$, the doping concentration of the drift zone 13 lies, for example, in the range of between $10^{12}$ cm$^{-3}$ and $10^{15}$ cm$^{-3}$, and the doping concentration of the body zone 12 lies, for example, in the range of between $10^{16}$ cm$^{-3}$ and $10^{19}$ cm$^{-3}$.

The transistor component additionally includes a diode structure, which realizes a diode connected between the drift zone 13 and the source electrode 21. In order to afford a better understanding, the circuit symbol of the diode is likewise illustrated in FIG. 1, where it is designated by the reference symbol 30. The circuit symbol of the diode as illustrated in FIG. 1 refers to an exemplary embodiment with an n-doped drift zone 13, that is to say for an n-conducting component. However, the diode structure illustrated in FIG. 1 can also be employed in the case of a p-conducting component, in which case the polarity of the diode is reversed relative to the illustration shown in FIG. 1. In this case, the individual component zones of the diode structure are to be doped correspondingly complementarily.

The diode structure includes a first emitter zone 31 of the second conduction type. The first emitter zone 31 is arranged in the semiconductor body 100 and adjoins the drift zone 13 in order to form a pn junction with the drift zone 13. The first emitter zone 31 comprises, in particular, a monocrystalline semiconductor material. The doping concentration of the first emitter zone 31 lies, for example, in the range of between $10^{16}$ cm$^{-3}$ and $10^{19}$ cm$^{-3}$.

The diode structure additionally has a second emitter zone 32 doped complementarily to the first emitter zone 31 and connected to the source electrode 21. An ohmic contact is present between the source electrode 21 and the second emitter zone 32. For the realization of the ohmic contact, a highly doped connection zone of the first conduction type (not illustrated) can be present in the second emitter zone 32. The task of the diode structure includes, in the case where the transistor component is switched on, in limiting the voltage drop between that section of the drift zone 13 which is adjoined by the first emitter zone 31 and the source electrode 21, to be precise to the value of the forward voltage of the diode structure. This functioning will be explained below.

For explanation purposes, it should be assumed in this case that the load path or drain-source path of the transistor component is connected in series with a load Z (illustrated by dashed lines) between a terminal for a positive supply potential V+ and a negative supply potential or reference potential GND. For explanation purposes, it should additionally be assumed that the component is an n-conducting component. In the circuit configuration explained, the transistor component serves as an electronic switch which can be driven in the on state and in the off state or switched on and off by a suitable control voltage being applied between the gate connection G and the source connection S. For explanation purposes, it should furthermore be assumed that the load Z, in the fault-free state, has an electrical resistance that is significantly higher than the on resistance of the transistor component. In this case, with the transistor component switched on, the supply voltage present between the terminal for the positive supply potential and the reference potential is substantially present across the load Z. The voltage drop across the drain-source path of the transistor component or between that section of the drift zone 13 which is adjoined by the first emitter zone 31 and the source electrode 21 is in this case lower than the forward voltage of the diode structure, such that the diode structure, in the case of a fault-free load, does not influence the functioning of the transistor component.

In the case of a short circuit of the load Z, the voltage between the drain connection D and the source connection S of the transistor component would rise considerably, by contrast, and would correspond to the supply voltage in the extreme case, such that a correspondingly high current would flow through the component. This current is also designated hereinafter as "short-circuit current". The diode structure having the first and second emitter zones 31, 32 serves, in the case of such a fault situation of the load Z, to limit the voltage drop across part of the load path, to be precise in particular across the channel region between a point C at the junction between the drift zone 13 and the body zone 12 and the source electrode 21, by virtue of a point C' at the pn junction between the drift zone 13 and the first emitter zone 31 being held at a low potential by means of the diode structure. As a result of this limiting of the voltage drop across part of the load path, the short-circuit current of the component is limited in a corresponding manner. The potential of the point C' is higher than the source potential merely by the forward voltage of the diode 30. In this case, across that part of the load path of the component with which the diode structure is connected in parallel, the load path voltage is limited to the value of the forward voltage of the diode structure.

The drift zone 13 and the first emitter zone 31 form a pn junction 18, which, in the case of an n-conducting component, is operated in the reverse direction in the case of a positive potential at the drain connection D. If, when the component is driven in the on state, the forward voltage of the diode structure is not reached, the first emitter zone 31 is at a floating potential, which can be somewhat lower than the potential of the drift zone 13 at the pn junction 18. The precise magnitude of the potential is set by way of the leakage current of the pn junction 18 and the threshold voltage of the diode 30 formed by the first and second emitter zones 31, 32, or the subthreshold current of the diode.

The forward voltage of the diode 30 determines the positive potential to which the first emitter zone 31 can rise maximally above the potential of the source connection S. In this way, the potential of the first emitter zone 31 and thus also the potential difference between the body zone 12 and the emitter zone 31 adjacent the gate electrode 15 are "clamped". Between the body zone 12 and the first emitter zone 31, therefore, a positive voltage of the magnitude of the forward voltage of the diode 30 formed by the emitter zones 31, 32 can maximally be present in the region of the points B and B'. Consequently, the voltage drop along the channel formed by the gate electrode 15 via the gate dielectric layer 16 is also limited. The maximum voltage drop along the channel in the short-circuit case in turn defines the magnitude of the short-circuit current. Therefore, by reducing the maximum channel voltage drop, it is likewise possible to reduce the level of the short-circuit current.

The diode structure forms, together with the drift zone 13 of the transistor component, a parasitic bipolar transistor, which is an npn bipolar transistor in the case of an n-conducting component and a pnp bipolar transistor in the case of a p-conducting component. In order to prevent the parasitic transistor structure from influencing the dielectric strength of the component when the component is turned off, that is to say when a voltage is present across the load path D-S of the transistor component, but the transistor component is switched off, it is provided that the second emitter zone 32 has a lowest possible emitter efficiency. This is tantamount to the second emitter zone 32 being able to take up charge carriers from the first emitter zone 31, and thus from the drift zone 13, but the second emitter zone 32 not or only slightly injecting charge carriers into the drift zone 13 via the first emitter zone 31.

If the forward voltage of the diode structure is reached, a first charge carrier current $j_{31}$ flows from the first emitter zone 31 into the second emitter zone 32, and a second charge carrier current $j_{32}$ flows from the second emitter zone 32 into the first emitter zone 31. One of the charge carrier currents is an electron current, to be precise the charge carrier current from that emitter zone which is n-doped, and one of the charge carrier currents is a hole current, to be precise the charge carrier current from that emitter zone which is p-doped. The emitter efficiency γ of the second emitter zone 32 that is relevant in the present case is defined as $$\gamma = 1 - \frac{j_{31}}{j_{31} + j_{32}}. \tag{1}$$

In this case, the properties of the first and of the second emitter zones 31, 32 are chosen such that the emitter efficiency γ of the second emitter zone 32 is less than 0.7, less than 0.5 or even less than 0.3. In this context, this is also referred to as a weak emitter. An emitter efficiency γ=0.5 is present, for example, when the first charge carrier current $j_{31}$ corresponds to the second charge carrier current $j_{32}$. If the second charge carrier current $j_{32}$ is less than the first charge carrier current, then the emitter efficiency of the second emitter zone 32 γ is less than 0.5. The emitter efficiency of the second emitter zone 32 can be determined for example indirectly on the basis of the forward voltage, which increases somewhat as the emitter efficiency decreases, or can be determined on the basis of simulations with the knowledge of the doping concentrations and other structural features of the first and second emitter zones 31, 32 on the basis of simulations.

In order to set the emitter efficiency of the second emitter zone 32 to one of the values that are so low, various measures are possible, which will be explained in detail below with reference to further figures.

In the exemplary embodiment illustrated in FIG. 1, the gate electrode 15 has two gate electrode sections, which are arranged at a distance from one another in a horizontal direction of the semiconductor body 100. In this case, the body zone 12 and the source zone 11 are arranged between the two gate electrode sections and are jointly contact-connected by the source electrode 21 in this region. In the case of conventional power transistors, the distances between two adjacent gate electrode sections lie in the range of between 1 µm and 50 µm, and the so-called pitch distance, that is to say the distance between two adjacent transistor cells, lies in the range of between 10 µm and 100 µm. These distances determine the transistor cell density and thus the on resistivity of the component. Reducing these distances would reduce the on resistance, but would also increase the short-circuit currents.

A diode structure having an emitter efficiency of the second emitter zone 32 within the range explained above leads to an effective reduction of the short-circuit current and, as a result, also permits higher cell densities. In one example, therefore, a pitch distance between 1 µm and 20 µm, and in particular less than 10 µm, is provided. The pitch distance can be chosen independently of the mutual distance between the gate electrode sections. The mutual distance between the gate electrode sections is, for example, less than 1 µm, less than 0.3 µm or even less than 0.1 µm. Such a small distance contributes, on the one hand, to increasing the cell density. On the other hand, such a small distance between the gate electrode sections leads, in the case of an IGBT, to a poorer flowing-away of the p-type charge carriers from the drift zone 13 via the body zone 12, thus giving rise to a charge carrier accumulation at the body zone 12, which ultimately leads to a reduction of the on-state losses.

Figure 2A:
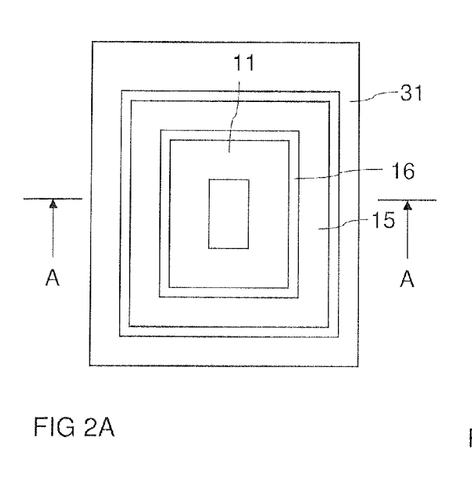
Figure 2B:
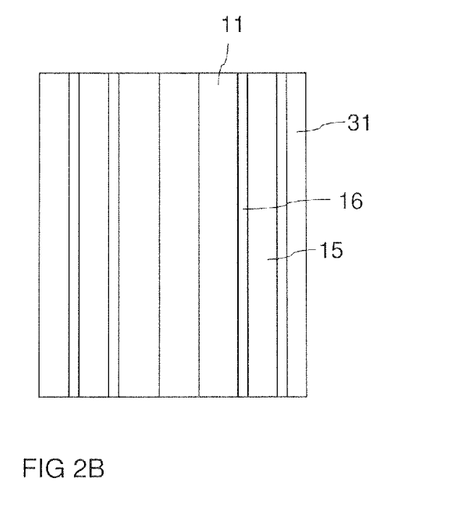

Referring to FIG. 2A, which shows a horizontal cross section in a sectional plane A-A through the component in accordance with FIG. 1, the gate electrode 15 can be arranged in a ring-shaped trench, wherein two mutually opposite sections of the gate electrode 15—as illustrated in FIG. 1—form gate electrode sections 15. Referring to FIG. 2B, which shows a horizontal cross section in the sectional plane A-A of a further component, the gate electrode 15 can also have gate electrode sections which are embodied in strip-shaped fashion and run substantially parallel to one another, wherein the body zone 12 and the source electrode 11 are arranged between two gate electrode sections running in a parallel fashion. The diode structure having the first and second emitter zones 31, 32 can—as is illustrated in particular in FIGS. 1, 2A and 2B—be arranged symmetrically around the gate electrode 15. In this case, the second emitter zone 32 is separated from the source zone 11 and the body zone 12 by the gate electrode 15 and the gate dielectric layer 16 in a horizontal direction of the semiconductor body 100, as is illustrated in FIG. 1. The second emitter zone 32 can be arranged—as illustrated—in particular at a distance from the gate dielectric layer 16 in a horizontal direction. In this case, an insulation layer 23 prevents the source electrode 21 from making contact with the first emitter zone 31.

The first emitter zone 31 can overlap the body zone 12 in a horizontal direction of the semiconductor body 100. In other words a section of the first emitter zone 31 is arranged between the body zone 12 and the drain zone 14 in the current flow direction of the component. The first emitter zone 31 can, in a horizontal direction, also end in the region below the gate electrode 15 (illustrated in a dashed fashion in the right-part of FIG. 1) or else can extend as far as the gate electrode 15 or the gate dielectric layer 16 only at the side facing away from the body zone 12 (illustrated in a dotted fashion in the right-hand part of FIG. 1). As a result, it is possible to vary the maximum voltage difference between the point C and the source electrode S, without the forward voltage of the diode 30 having to be altered, since the distance between the point C', which is at a potential defined by the diode structure, and the point C is increased. In the case of the vertical component illustrated in FIG. 1, the current flow direction is a vertical direction of the semiconductor body 100. In this case, a section of the drift zone 13 is arranged between the body zone 12 and the first emitter zone 31.

The transistor component can be constructed in a cellular fashion, that is to say can have a multiplicity of the transistor structures which are illustrated in FIG. 1 or FIGS. 2A and 2B and which are connected in parallel, that is to say whose gate electrodes are connected to a common gate connection G and whose source and body zones are connected to a common source connection S. In this case, the drift zone 13 and the drain zone 14 can be common to the individual transistor cells.

The second emitter zone 32 having the low emitter efficiency is merely illustrated schematically in FIG. 1. There are various possibilities for realizing the second emitter zone 32, some of which will be explained below on the basis of examples.

The second emitter zone 32 is ohmically connected to the source electrode 21, that is to say that an ohmic contact is present between the second emitter zone 32 and the source electrode 21. When conventional donors such as phosphorus or arsenic are used, doping concentrations of above approximately $10^{19}$ cm$^{-3}$ are required in order to obtain an ohmic contact. On the other hand, the integral dopant dose of the second emitter zone 32 ought not to exceed the integral dopant dose of the first emitter zone 31, in order that the emitter efficiency remains as low as possible, that is to say within the range specified above. In the case of a doping of the first emitter zone 31 of between $10^{16}$ cm$^{-3}$ and $10^{19}$ cm$^{-3}$ and a penetration depth—that is to say a dimension of the first emitter zone in a vertical direction—of between 1 µm and 10 µm, for example, the dopant dose of the first emitter zone 31, and hence the upper limit of the dopant dose of the second emitter zone 32, lie between approximately 1 µm·$10^{16}$ cm$^{-3}$=1·$10^{12}$ cm$^{-2}$ and 10 µm·$10^{19}$ cm$^{-3}$=10·$10^{16}$ cm$^{-2}$. Consequently, the penetration depth of the second emitter zone 32, in particular in the region of the low dopant doses, is intended to be as small as possible, in order that it is simultaneously possible to ensure a high edge concentration for the ohmic contact and a low dose for a weak emitter. With the boundary condition that penetration depths of arsenic that are realized technically by means of implantation are a minimum of approximately 50 nm (corresponds to a maximum doping concentration of 2·$10^{17}$ cm$^{-3}$ given a desired target dose of 1·$10^{12}$ cm$^{-2}$), it is evident that the above requirement cannot be met for all dimensioning ranges.

Therefore, one exemplary embodiment provides for the second emitter zone 32 to be doped with selenium or sulfur. Such a sulfur or selenium doping can be combined with a low doping of conventional dopants, such as e.g. phosphorus, arsenic or antimony.

If selenium is introduced into the semiconductor layer in a concentration far above its solubility limit—for example with a concentration in the range of greater than $10^{19}$ cm$^{-3}$—then the high doping concentration—in the form of a selenium concentration—required for the ohmic contact-connection of n-doped silicon is present.

Selenium is suitable as contact material since, in the silicon crystal, it both acts as a donor and equally conducts current in its so-called "gray modification", i.e. exhibits metallic character. However, selenium has a solubility in silicon which amounts to only a fraction of the abovementioned selenium concentration. This has the consequence that only this fraction, too, of the introduced selenium atoms can be electrically active for the first emitter zone 31.

Selenium has a maximum solubility of approximately $8 \cdot 10^{18}$ cm$^{-3}$, for example, in silicon. Moreover, selenium is a "deep donor", that is to say that the donor level is approximately 250 meV below the conduction band edge. At room temperature, only a small proportion, e.g. less than 20%, of the introduced selenium is ionized and thus active as donor doping or emitter doping.

One exemplary embodiment provides for the semiconductor region of the second emitter zone 32 which is doped with selenium or sulfur to be adjacent the source electrode 21, and for a semiconductor region which is weakly doped with customary dopant atoms, such as phosphorus, arsenic or antimony, to be arranged between the semiconductor region doped with selenium or sulfur and the first emitter zone 31. A further exemplary embodiment provides for selenium or sulfur atoms to be diffused from the region adjacent the source electrode 21 in the direction of the pn junction by means of a thermal step, as a result of which the emitter efficiency is also reduced in the regions of the second emitter zone 32 which are situated closer to the pn junction of the diode structure. Selenium or sulfur is suitable for producing an n-doped second emitter zone 32.

Figure 3:
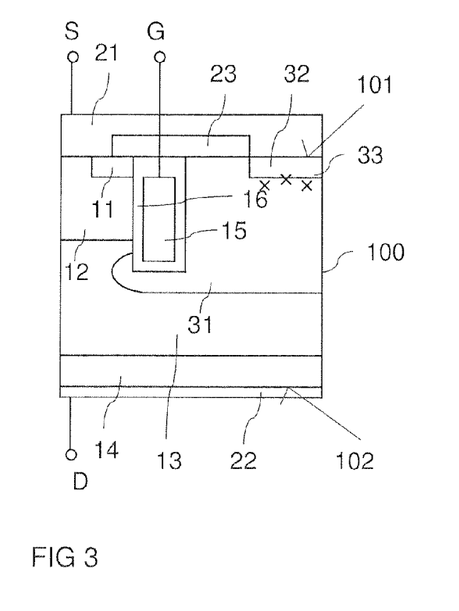
FIG. 3 illustrates a vertical cross section through a transistor component including a diode structure, wherein the diode structure has means for reducing the carrier lifetime.

FIG. 3 illustrates, on the basis of a vertical cross section through the transistor component, an exemplary embodiment of a second emitter zone 32, the emitter efficiency of which is reduced by the fact that crystal defects 33, which are merely illustrated schematically in FIG. 3 by the symbol 'x', are present in the region of the pn junction between the first and second emitter zones 31, 32, and in particular in the first emitter zone 31 in the region of the pn junction. Such crystal defects can be produced for example by ion implantation, such as, for example, implantation of arsenic ions, argon ions, oxygen ions, helium ions, protons, or electrons or semiconductor atoms, such as e.g. silicon atoms. Optionally, a more highly doped zone of the second conduction type is present in the first emitter zone 31 in a region between the crystal defects 33 and remaining regions of the first emitter zone 31. The more highly doped zone acts as a diffusion barrier for leakage currents from the second emitter zone 32, that is to say as a diffusion barrier for electron currents if the second emitter zone 32 is n-doped. Such a more highly doped zone simultaneously acts as a "brake" for electrons injected from the second emitter zone 32 in the forward operation of the diode 40 described above.

The maximum doping concentration of the second emitter zone 32 lies, for example, in the range above $10^{19}$ cm$^{-3}$ for a donor doping, that is to say in the case of an n-doped second emitter zone, and is above $10^{17}$ cm$^{-3}$ for an acceptor doping, that is to say in the case of a p-doped second emitter zone. The second emitter zone 32 can be doped with conventional dopants, that is to say for example with phosphorus (P), arsenic (As), or antimony (Sb) in the case of an n-doped second emitter zone, or with boron (B) in the case of a p-doped second emitter zone 32.

The crystal defects 33 in the region of the pn junction or in the second emitter zone 32 along the pn junction bring about a reduction of the charge carrier lifetime of the charge carriers injected from the second emitter zone 32 into the first emitter zone 31, which results overall in a reduced efficiency of the second emitter zone 32. The crystal defects brought about by the implantations explained above can be stabilized by a thermal step, wherein the semiconductor body 100 is heated to temperatures of between 180° C. and 350° C. in particular in the region of the pn junction between the first and second emitter zones 31, 32. At higher temperatures, the crystal defects 33 would anneal. Should temperatures higher than 350° C. be necessary for other reasons, the crystal defects 33 can be produced, in particular, by means of an argon implantation. The crystal defects 33 produced by means of such an argon implantation anneal only at higher temperatures.

One exemplary embodiment provides for the second emitter zone 32 to be doped with conventional dopants, such as e.g. with phosphorus for an n-doped second emitter zone or e.g. with boron for a p-doped second emitter zone 32. These dopants are introduced into the region of the second emitter zone 32 by means of a shallow ion implantation, that is to say an implantation having a small penetration depth, wherein only thermal steps with a maximum temperature of approximately 450° C., or even only with a maximum temperature of approximately 420° C., are carried out after the implantation. A metallization, in particular an aluminum-containing metallization, can already be situated on the semiconductor surface during the thermal step. In the case of thermal steps with the low temperatures mentioned above, a large portion of the crystal defects 33 produced by the ion implantation is maintained in the region of the second emitter zone 32, which likewise lead to a reduction of the carrier lifetime and hence to a low emitter efficiency. Consequently, it is possible to introduce into the semiconductor considerably higher dopant doses than in the case of at least predominantly annealed dopings, and it is nevertheless possible to achieve a low emitter efficiency. On the other hand, the higher dopant concentration facilitates or enables an ohmic contact of the second emitter zone 32 with the source electrode 21. Typical implantation doses lie in the range above approximately $4 \cdot 10^{14}$ cm$^{-2}$, in particular above approximately $1 \cdot 10^{15}$ cm$^{-2}$, for phosphorus, and above approximately $1 \cdot 10^{12}$ cm$^{-2}$, in particular above $5 \cdot 10^{12}$ cm$^{-2}$, for boron.

Instead of producing crystal defects 33 in the region of the pn junction between the first and second emitter zones 31, 32, in order to reduce the charge carrier lifetime, heavy metal atoms such as e.g. platinum atoms or gold atoms can also be introduced into the region of the pn junction. Such atoms likewise provide for a reduction of the charge carrier lifetime and thus for reduction of the efficiency of the second emitter zone 32. The heavy metal atoms can be introduced into the region of the pn junction by means of ion implantation in a sufficiently known manner. One exemplary embodiment provides for producing lattice vacancies in the region of the pn junction by means of other irradiation techniques, such as e.g. proton or electron irradiation, into which vacancies the heavy metal atoms are then introduced more easily or with a higher concentration than in undisturbed regions.

A second emitter zone 32 doped with selenium or sulfur can be arranged in the semiconductor body 100 and comprise a monocrystalline semiconductor material. The same applies to the second emitter zone—explained with reference to FIG. 3—of a diode structure which has means for reducing the charge carrier lifetime.

Figure 4:
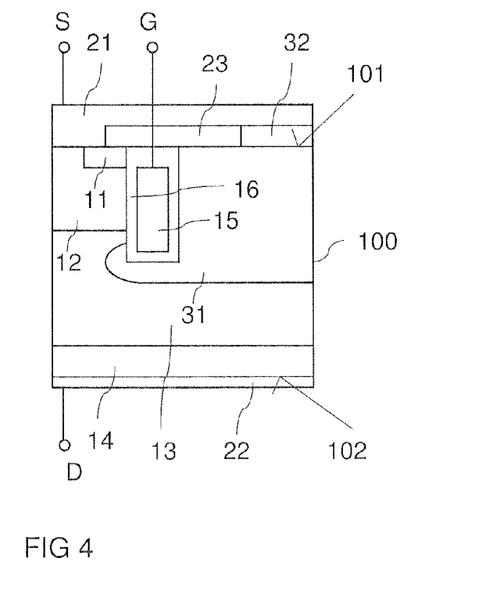
FIG. 4 illustrates a vertical cross section through a transistor component including a diode structure, wherein one of the emitter zones of the diode structure comprises a polycrystalline semiconductor material.

FIG. 4 shows a further exemplary embodiment of a transistor component including a diode structure. In the case of this component, the second emitter zone 32 is arranged above the front side 101 of the semiconductor body 100 and comprises a polycrystalline semiconductor material, such as polysilicon, in particular, doped with dopant atoms of the first conduction type. Polysilicon has a disturbed crystal structure having many grain boundaries, as a result of which the carrier lifetimes in polysilicon are very short. The function of a second emitter zone 32 composed of polysilicon is analogous to the above-described second emitter zone 32 with implantation defects that have not been annealed or have not been completely annealed. Instead of comprising a polycrystalline semiconductor material, the second emitter zone 32 can also comprise an amorphous semiconductor material.

Figure 5A:
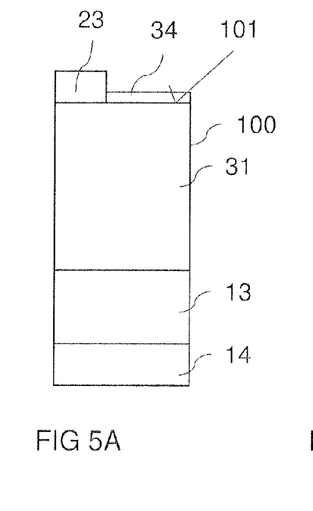
Figure 5B:
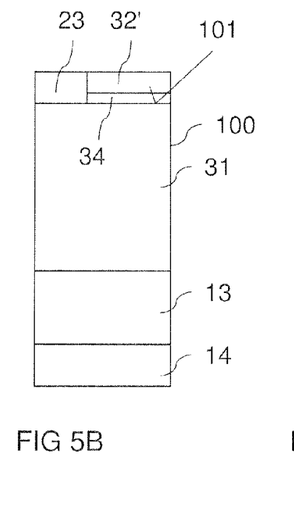
Figure 5C:
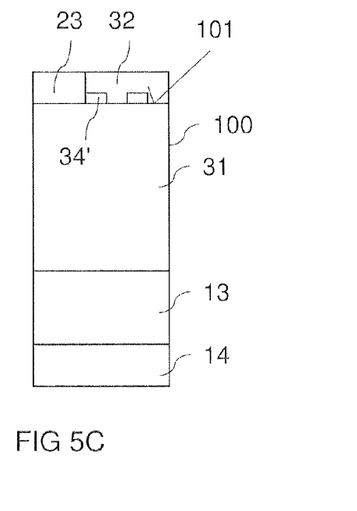

One possible method for producing a second emitter zone 32 composed of a doped polycrystalline semiconductor material is explained below with reference to FIGS. 5A to 5C, which each show a vertical cross section through the semiconductor body 100 in the region of the diode structure. Referring to FIG. 5A, after the production of the first emitter zone 31, e.g. by means of local ion implantation and subsequent outdiffusion of the dopants into the semiconductor body 100, on the front side 101 of the semiconductor body 100, a diffusion barrier layer 34, such as an oxide layer, for example, is produced. A doped polycrystalline semiconductor layer 32' is subsequently produced on the diffusion barrier layer 34, such as by a deposition process, for example. During the production of the polycrystalline semiconductor layer 32', the diffusion barrier layer 34 prevents dopant atoms from diffusing from the polycrystalline semiconductor layer 32' into the semiconductor body 100, and hence the first emitter zone 31.

The diffusion barrier layer 34 is subsequently "broken up" or even "resolved" by means of a thermal step wherein the semiconductor body 100 is heated at least in the region of the diffusion barrier 34. Residues of the diffusion barrier 34 are represented with the reference symbol 34' in FIG. 5C. In order to enable the diffusion barrier 34 to be broken up or resolved, the diffusion barrier 34 can be realized as a thin layer, in particular as a layer having a layer thickness of less than approximately 4 nm, in particular less than approximately 2 nm.

Figures 6A, 6B:
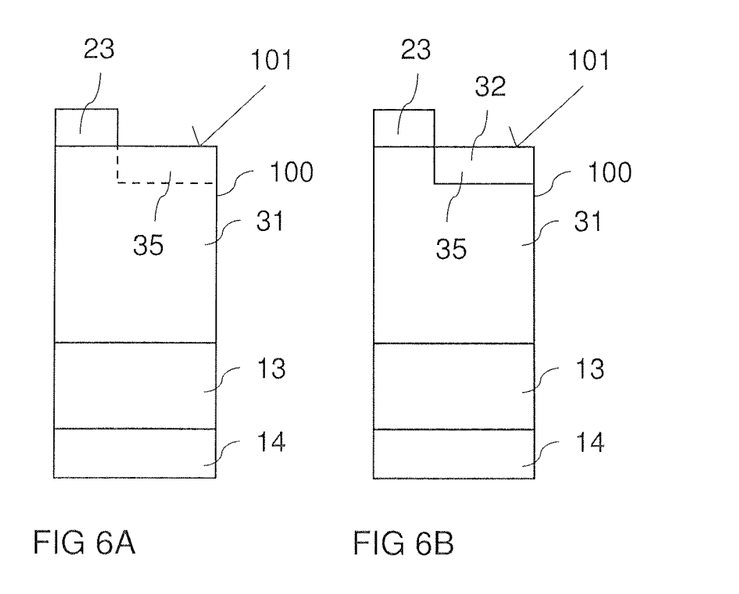

A further exemplary embodiment for realizing a second emitter zone 32 having a low emitter efficiency provides for producing the second emitter zone 32 in a region in which the semiconductor body 100 is porous or comprises porous semiconductor material. FIGS. 6A and 6B, which each show a vertical cross section through the semiconductor body 100 in the region of the diode structure, illustrate the production of such a second emitter zone 32. Referring to FIG. 6A, firstly a region of the semiconductor body 100 in which the second emitter zone 32 is to be produced is made porous or porosified. The recombination of n-type charge carriers for example from an n-type emitter zone with p-type charge carriers from a p-type emitter zone always occurs at the surface of semiconductors. The semiconductor surface area and hence the surface recombination are drastically increased in the case of a porosified semiconductor material. As a result, this reduces the minority carrier lifetime in the emitter zones and hence the emitter efficiency. Referring to FIG. 6B, dopant atoms of the first conduction type are subsequently introduced into the porous section 35 of the semiconductor body 100 by means of an implantation method and/or a diffusion method. Within the porous section 35 of the semiconductor body 100, the charge carrier lifetime is greatly reduced, such that a second emitter zone 32 produced in this way only has a low efficiency or a low emitter efficiency.

Figure 7A:
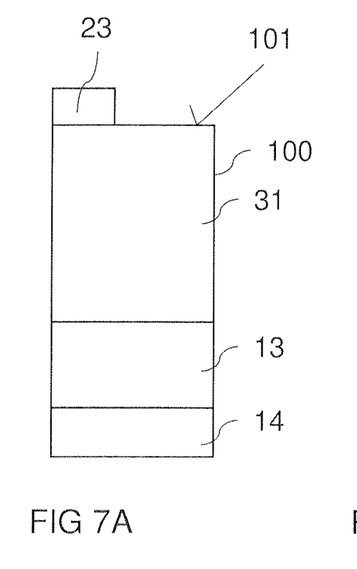
Figure 7B:
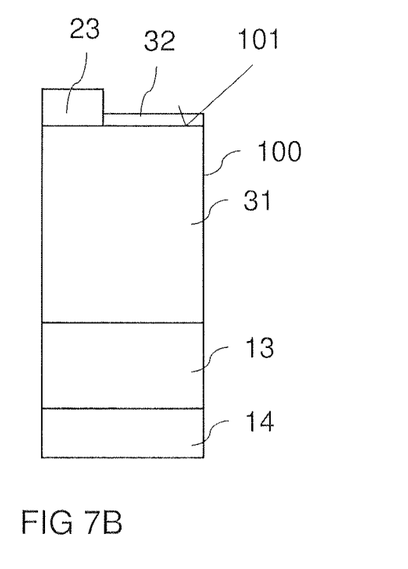

A further exemplary embodiment provides for the second emitter zone 32 to be realized as a silicon-germanium (SiGe) layer. A method for producing such a second emitter zone 32 is explained below with reference to FIGS. 7A and 7B, which each show a vertical cross section through the semiconductor body 100 in the region of the diode structure. Referring to FIG. 7A, in this method, firstly the first emitter zone 31 is produced. Afterward, on the front side 101 of the semiconductor body 100 following the first emitter zone 31, an $Si_{1-x}Ge_x$ layer is deposited, which is subsequently contact-connected by the source electrode 21 (not illustrated in FIGS. 7A and 7B). In the case of an SiGe emitter, the smaller band gap of the SiGe layer is utilized, which is all the smaller, the higher the Ge proportion of the emitter. In this way, both the threshold voltage of the pn junction formed and the carrier injection into the pure Si (having a higher band gap) are reduced, such that a low emitter efficiency is present as a result.

There is also the possibility of combining with one another a plurality of the measures explained above for realizing a second emitter zone 32 having a low emitter efficiency. Thus, by way of example, a polycrystalline emitter zone 32 such as has been explained with reference to FIGS. 5A to 5C can be doped with selenium or sulfur. In a corresponding manner, a second semiconductor zone 32 realized in a porous semiconductor region 35 (cf. FIGS. 6A and 6B) can be doped with selenium or sulfur. A second emitter zone composed of silicon-germanium such as has been explained with reference to FIGS. 7A and 7B can be combined for example with means for reducing the charge carrier lifetime such as have been explained with reference to FIG. 3.

In the case of the exemplary embodiments explained above, the first emitter zone 31 of the diode structure extends adjacent to the gate electrode 15 as far as the front side 101 or to just below the front side 101 of the semiconductor body 100, and the second emitter zone 32 is arranged in a manner following the front side 101 of the semiconductor body 100, or is arranged on the front side 101 of the semiconductor body 100 and in each case contact-connected by the source electrode 21. This manner of realizing the diode structure is merely an example. The diode structure having the first emitter zone 31 composed of monocrystalline semiconductor material, the first emitter zone 31 being arranged in the semiconductor body 100, and the second emitter zone 32 having a low emitter efficiency, which is connected to the source electrode 21, can be modified in diverse ways in relation to the structure explained previously.

Figure 8:
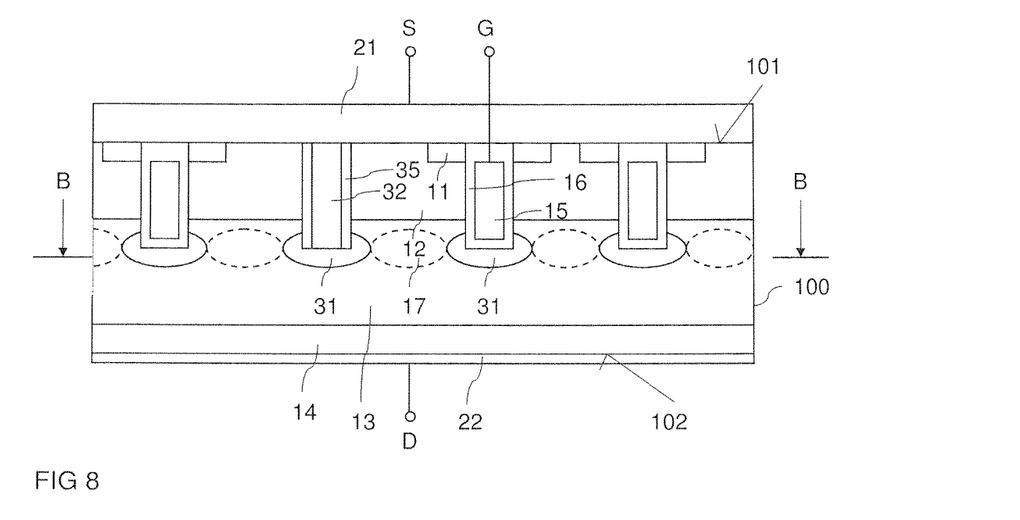
FIG. 8 illustrates a vertical cross section through a transistor component including a diode structure in accordance with a further exemplary embodiment.

FIG. 8 illustrates, on the basis of a vertical cross section, an exemplary embodiment of a transistor component wherein the first emitter zone 31 is realized as a buried semiconductor layer in the drift zone 13. In the case of this component, the second emitter zone 32 is arranged in a trench extending into the first emitter zone 31 in the vertical direction proceeding from the front side 101. In the example illustrated, the trench extends through the body zone 12 and part of the drift zone 13. In this case, the second emitter zone 32 is insulated from the body zone 12 and the drift zone 13 by means of an insulation layer 35 such as, for example, an oxide layer or a nitride layer. In the region of the front side 101 of the semiconductor body 100, the second emitter zone 32 is connected to the source electrode 21. In this exemplary embodiment, the pn junction between the first emitter zone 31 and the second emitter zone 32 is arranged in a buried fashion in the semiconductor body.

The transistor component illustrated in FIG. 8 is realized as a trench transistor including a gate electrode 15 arranged in a trench of the semiconductor body 100. A plurality of sections of the gate electrode 15 are illustrated in the vertical cross section illustrated in FIG. 8. The first emitter zone 31 likewise has a plurality of sections which are in each case arranged below the gate electrode 15 and which overlap the body zone 12 in some sections in a horizontal direction. These individual sections of the first emitter zone 31 are connected to one another within the semiconductor body 100, as a result of which all the sections of the first emitter zone 31 are connected to the section that forms the pn junction with the second emitter zone 32.

Figure 9:
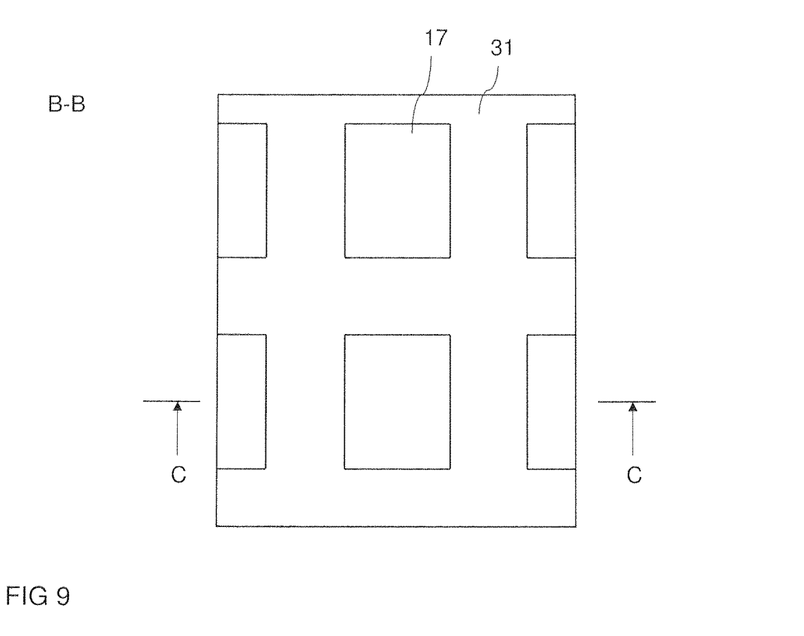
FIG. 9 illustrates a horizontal cross section through an exemplary embodiment of a component in accordance with FIG. 8.

Referring to FIG. 9, which shows a horizontal cross section in the sectional plane B-B illustrated in FIG. 8, the first emitter zone 31 is realized in a lattice-shaped fashion, for example. The gate electrode (not illustrated in FIG. 9) arranged above the first emitter zone 31 can have a corresponding lattice-shaped geometry or else a strip-shaped geometry. Even though only one trench with the second emitter zone 32 is illustrated in FIG. 8, it should be pointed out that a plurality of such trenches with a second emitter zone 32 can be present, wherein these trenches with the second emitter zone 32 are arranged in each case at a distance from the trenches with the gate electrode. Doping regions in real components always have certain outdiffusions and hence roundings of the boundaries depending on the methods used. Referring to FIGS. 8 and 9, this means that the corners shown there may in reality actually be rounded.

Between the individual sections of the first emitter zone 31, referring to FIG. 8, more highly doped zones 17 of the first conduction type can be arranged in the drift zone 13. These more highly doped zones 17 can contribute to reducing the on resistance of the component.

The second emitter zone 32 is merely illustrated schematically in FIG. 8. The second emitter zone 32 has a reduced emitter efficiency. In order to realize these second emitter zones 32 having a reduced emitter efficiency, all of the measures explained above with reference to FIGS. 1 to 7 can be employed in a corresponding manner. Thus, the second emitter zone 32 can comprise, for example, a polycrystalline semiconductor material, of silicon-germanium or of a porous semiconductor material, or of a monocrystalline semiconductor material with crystal defects.

Figure 10:
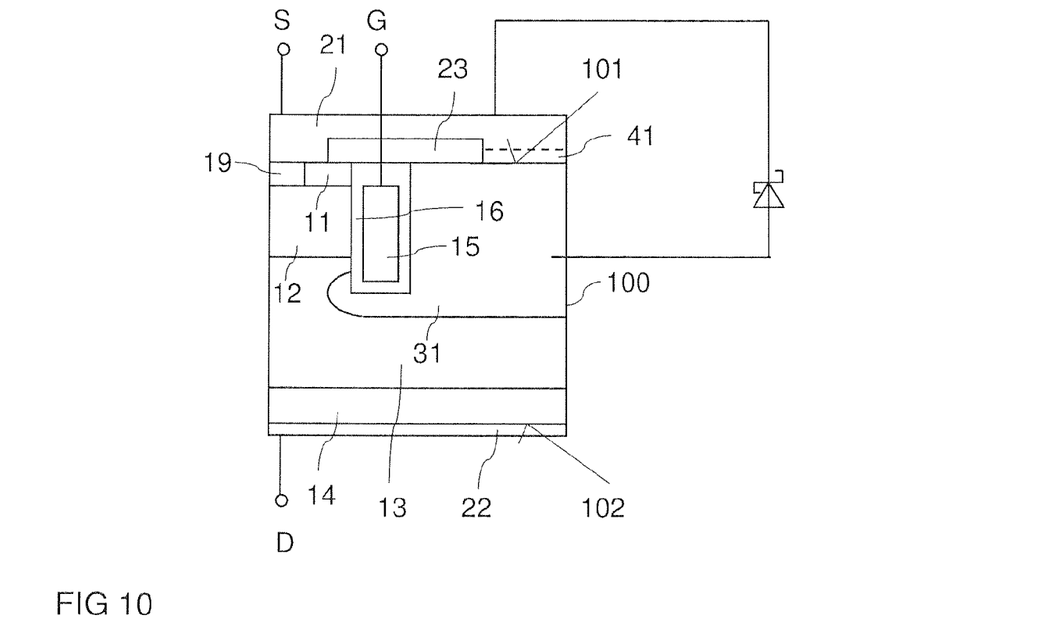
FIG. 10 illustrates a vertical cross section through a transistor component having a Schottky diode structure.

FIG. 10 illustrates, on the basis of a vertical cross section, a further exemplary embodiment of a transistor component including a diode structure. This diode structure is a Schottky diode structure, formed by the first emitter zone 31 and a Schottky electrode 41. The Schottky electrode 41 together with the first emitter zone 31 forms a Schottky contact. The Schottky electrode 41 is contact-connected by the source electrode 21 or forms the source electrode 21. In the latter case, the Schottky electrode 41 also makes contact with the source zone 11 and the body zone 12 or a more highly doped connection zone 19 of the body zone 12, wherein an ohmic contact is present between these zones and the Schottky electrode 41.

In the case of an n-conducting component, the first emitter zone 31 is p-doped. In order to produce a Schottky contact on a p-doped semiconductor zone, palladium silicide (Pd$_2$Si), for example, is suitable as material of the Schottky electrode 41. The doping concentration of the first emitter zone 31 is between $10^{15}$ cm$^{-3}$ and $10^{16}$ cm$^{-1}$, for example.

The Schottky diode structure forms a Schottky diode, the circuit symbol of which is likewise illustrated in FIG. 10. A Schottky diode is a unipolar component which takes up charge carriers from the drift zone 13, but which does not inject charge carriers into the drift zone 13. This is tantamount to an n-type emitter efficiency of the Schottky diode being approximately equal to zero in the case of a p-doped first emitter zone 13, or to a p-type emitter efficiency of the Schottky diode being approximately equal to zero in the case of a n-doped first emitter zone 31. In the case of very high current densities, Schottky diodes can also inject, although the injection is significantly lower than in the case of conventional pn diodes.

Figure 11:
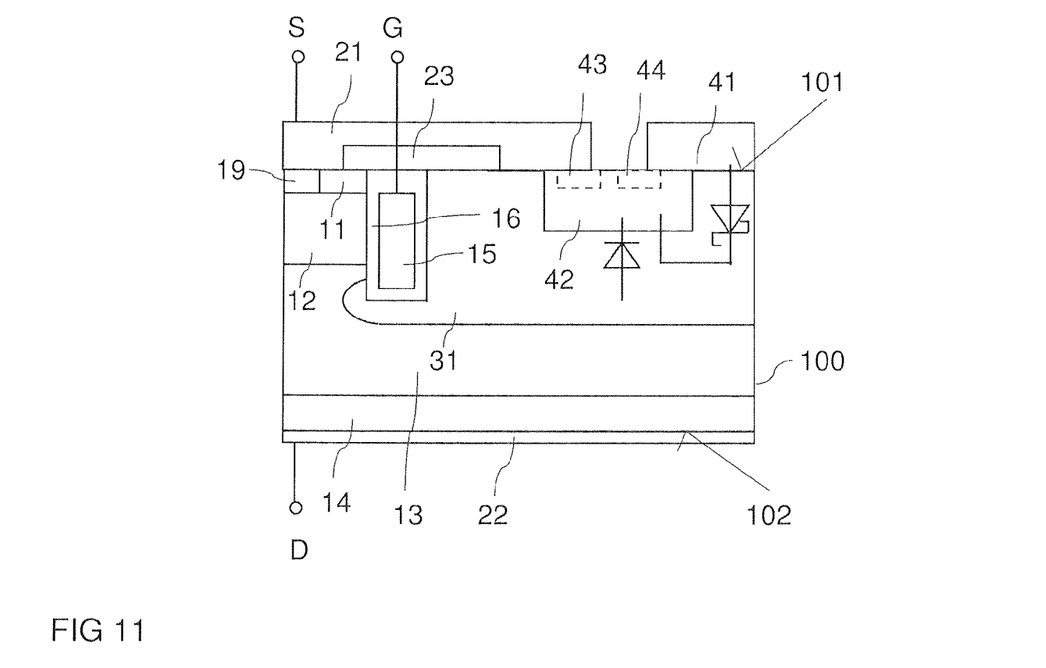
FIG. 11 illustrates a vertical cross section through a transistor component including a Schottky diode structure in accordance with a second exemplary embodiment.

FIG. 11 illustrates, on the basis of a vertical cross section, a further exemplary embodiment of a transistor component including a diode structure. In the case of this component, a Schottky diode structure is arranged between the first emitter zone 31 and the source electrode 21. The Schottky diode structure includes a semiconductor zone 42 of the first conduction type, which is contact-connected by a Schottky electrode 41 and together with the Schottky electrode 41 forms a Schottky contact. The semiconductor zone 42 is connected to the source electrode 21, wherein a more highly doped connection zone 43 of the first conduction type for connecting the semiconductor zone 42 to the source electrode 21 can optionally be provided. The Schottky electrode 41 additionally makes contact with the first emitter zone 31, wherein the Schottky electrode 41 and/or the doping concentration of the first emitter zone 31 are/is chosen such that an ohmic contact is present between the Schottky electrode 41 and the first emitter zone 31. Optionally, a highly doped guard ring 44 of the second conduction type is arranged between the connection zone 43 and the Schottky electrode 41.

A pn junction or a pn diode, the circuit symbol of which is likewise illustrated in FIG. 11, is formed between the first emitter zone 31 and the semiconductor zone 42 of the Schottky diode structure. In this case, the Schottky diode structure is chosen, in particular, such that the forward voltage of the Schottky diode is lower than that of the pn diode, such that the pn diode remains inactive.

The diode structure illustrated with reference to FIG. 11 is suitable, in particular, in the case of n-conducting components wherein the first emitter zone 31 is p-doped. As is illustrated with reference to FIG. 10, although a Schottky contact can also be produced with respect to a p-doped semiconductor material, such as the first emitter zone 31, a plurality of suitable materials for the Schottky electrode 41, such as silicides, for example, are available for realizing a Schottky contact on n-doped semiconductor material, such as, for example, the semiconductor zone 42 in accordance with FIG. 11. Furthermore, the forward voltage of a Schottky diode which is based on an n-doped semiconductor material can be set, on the basis of the choice of the material of the Schottky electrode, over a wider range than the forward voltage of a Schottky diode which is based on p-doped semiconductor material.

Figure 12:
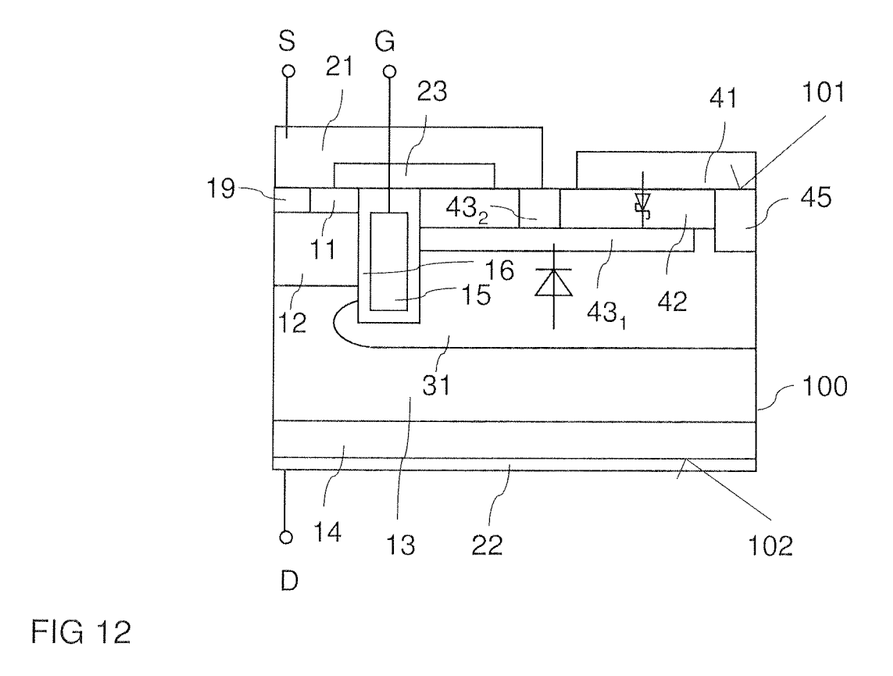
FIG. 12 illustrates a vertical cross section through a transistor component including a Schottky diode structure in accordance with a third exemplary embodiment.

FIG. 12 illustrates, on the basis of a vertical cross section through the semiconductor body 100, a further exemplary embodiment of a Schottky diode structure. This exemplary embodiment is based on the exemplary embodiment illustrated with reference to FIG. 11 and differs from the exemplary embodiment in accordance with FIG. 11 in that the connection zone 43, in the vertical direction of the semiconductor body 100, is arranged at a distance from the Schottky electrode 41 and thus the front side 101 of the semiconductor body and is connected to the source electrode 21 via a contact zone $43_2$ extending from the buried section $43_1$ as far as the front side 101. The first emitter zone 31 is connected to the Schottky electrode 41 via a further contact zone 45 extending into the emitter zone 32 proceeding from the front side 101 through the semiconductor zone 42.

The transistor components explained with reference to FIGS. 10 to 12 are based, with regard to the transistor structure, on the exemplary embodiment explained with reference to FIG. 1. In this context, a Schottky diode structure such as has been explained with reference to FIGS. 10 to 12 can be used, of course, in the case of components including any desired transistor structures. In accordance with the transistor component explained with reference to FIG. 8, the Schottky diode structure can also be arranged partly in a trench of the semiconductor body 100. Thus, the component illustrated in FIG. 8 can be modified in a simple manner by arranging the Schottky electrode in the trench instead of the second emitter zone 32.

Features explained on the basis of one exemplary embodiment can be combined with any desired features of other exemplary embodiments, even if that has not been explicitly explained beforehand.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A transistor component, comprising:
   in a semiconductor body a source zone and a drift zone of a first conduction type;
   a body zone of a second conduction type complementary to the first conduction type, the body zone being arranged between the drift zone and the source zone;
   a source electrode in contact with the source zone and the body zone;
   a gate electrode adjacent the body zone and dielectrically insulated from the body zone by a gate dielectric layer;
   a diode structure connected between the drift zone and the source electrode and which comprises:
      a first emitter zone adjoining the drift zone in the semiconductor body; and
      a second emitter zone of the first conduction type adjoining the first emitter zone,
      the second emitter zone being connected to the source electrode and having an emitter efficiency $\gamma$ of less than 0.7.

2. The transistor component as claimed in claim 1, wherein the emitter efficiency of the second emitter zone is less than 0.5 or less than 0.3.

3. The transistor component as claimed in claim 1, wherein the first emitter zone comprises a monocrystalline semiconductor material.

4. The transistor component as claimed in claim 1, wherein the first emitter zone is p-doped, and wherein the second emitter zone is n-doped and comprises sulfur or selenium as dopant atoms.

5. The transistor component as claimed in claim 1, wherein the second emitter zone comprises a porous semiconductor material.

6. The transistor component as claimed in claim 1, wherein the second emitter zone comprises a doped monocrystalline semiconductor material having crystal defects or a polycrystalline or amorphous semiconductor material.

7. The transistor component as claimed in claim 1, wherein the gate electrode is arranged between the second emitter zone and the body zone.

8. The transistor component as claimed in claim 1, wherein the gate electrode is arranged in at least one trench which extends into the semiconductor body in a vertical direction preceding from one side of the semiconductor body, and has at least two gate electrode sections arranged at a distance from one another in a lateral direction of the semiconductor body, wherein at least one section of the body zone is arranged between the at least two gate electrode sections.

9. The transistor component as claimed in claim 1, wherein the transistor component is a MOSFET and further comprises a drain zone of the first conduction type.

10. A transistor component, comprising:
    in a semiconductor body a source zone and a drift zone of a first conduction type;
    a body zone of a second conduction type complementary to the first conduction type, the body zone being arranged between the drift zone and the source zone;
    a source electrode in contact with the source zone and the body zone;
    a gate electrode adjacent the body zone and dielectrically insulated from the body zone by a gate dielectric layer; and
    a Schottky diode structure connected between the drift zone and the source electrode, the Schottky diode structure comprising a first emitter zone of the second conduction type adjoining the drift zone and extending to a surface of the semiconductor body at which the source electrode is disposed.

11. The transistor component as claimed in claim 10, wherein the Schottky diode structure further comprises a Schottky electrode in contact with the first emitter zone and connected to the source electrode.

12. The transistor component as claimed in claim 11, wherein the Schottky electrode forms the source electrode.

13. The transistor component as claimed in claim 10, wherein the Schottky electrode structure furthermore comprises:
    a second emitter zone of the second conduction type connected to the source electrode; and
    a Schottky electrode in contact with the first emitter zone and the second emitter zone.

14. The transistor component as claimed in claim 10, wherein the transistor component is a MOSFET and further comprises a drain zone of the first conduction type.

15. The transistor component as claimed in claim 10, wherein transistor component is an IGBT and further comprises a drain zone of the second conduction type.

16. The transistor component as claimed in claim 10, wherein the gate electrode is arranged in at least one trench which extends into the semiconductor body in a vertical direction preceding from one side of the semiconductor body, and has at least two gate electrode sections arranged at a distance from one another in a lateral direction of the semiconductor body, wherein at least one section of the body zone is arranged between the at least two gate electrode sections.

17. The transistor component as claimed in claim 16, wherein a mutual distance between the at least two gate electrode sections is less than 1 μm, less than 0.3 μm or less than 0.1 μm.

18. The transistor component as claimed in claim 13, wherein the gate electrode is arranged between the second emitter zone and the body zone.

19. The transistor component as claimed in claim 13, wherein the second emitter zone is arranged in a trench extending into the semiconductor body proceeding from the first side, wherein the second emitter zone is insulated from the body zone by means an insulation layer.

20. The transistor component as claimed in claim 10, wherein the first emitter zone of the Schottky diode structure extends deeper into the semiconductor body from the surface than the body zone.

* * * * *

UNITED STATES PATENT AND TRADEMARK OFFICE
CERTIFICATE OF CORRECTION

PATENT NO.        : 10,211,057 B2                                Page 1 of 1
APPLICATION NO.   : 13/197903
DATED             : February 19, 2019
INVENTOR(S)       : F. Hirler et al.

It is certified that error appears in the above-identified patent and that said Letters Patent is hereby corrected as shown below:

In the Claims

Column 16, Line 57 (Claim 15, Line 2) please change "wherein transistor" to -- wherein the transistor --

Column 17, Line 12 (Claim 19, Line 5) please change "means an" to -- means of an --

Signed and Sealed this
Twenty-ninth Day of October, 2019

Andrei Iancu
*Director of the United States Patent and Trademark Office*